United States Patent
Wang

(10) Patent No.: US 11,525,038 B2
(45) Date of Patent: Dec. 13, 2022

(54) CROSSLINKED POLYMIDE, POLYMIDE FILM AND METHOD FOR PREPARING THEREOF, ORGANIC LIGHT EMITTING DIODE DEVICE

(71) Applicant: Wuhan China Star Optoelectronics Semiconductor Display Technology Co., Ltd., Wuhan (CN)

(72) Inventor: Yamin Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 529 days.

(21) Appl. No.: 16/611,224

(22) PCT Filed: Jun. 14, 2019

(86) PCT No.: PCT/CN2019/091296
§ 371 (c)(1),
(2) Date: Nov. 6, 2019

(87) PCT Pub. No.: WO2020/232778
PCT Pub. Date: Nov. 26, 2020

(65) Prior Publication Data
US 2020/0369832 A1 Nov. 26, 2020

(30) Foreign Application Priority Data
May 21, 2019 (CN) .................. 201910421646.X

(51) Int. Cl.
*C08G 73/10* (2006.01)
*C08J 5/18* (2006.01)
*H01L 51/00* (2006.01)

(52) U.S. Cl.
CPC ............ *C08G 73/1085* (2013.01); *C08J 5/18* (2013.01); *H01L 51/0035* (2013.01);
(Continued)

(58) Field of Classification Search
None
See application file for complete search history.

(56) References Cited

U.S. PATENT DOCUMENTS

| 6,340,506 B1 | 1/2002 | Buchecker et al. |
| 6,417,321 B1* | 7/2002 | Minami ................. C08G 73/10 528/229 |
| 2001/0035714 A1* | 11/2001 | Lu ....................... H01L 27/3283 313/506 |
| 2003/0039768 A1 | 2/2003 | Buchecker et al. |

(Continued)

FOREIGN PATENT DOCUMENTS

| CN | 1271370 | 10/2000 |
| CN | 1395593 | 2/2003 |

(Continued)

OTHER PUBLICATIONS

Ghaemy et al. "Synthesis of Soluble and Thermally Stable Polyimide From New Diamine Bearing N-[4-(9H-Carbazol-0-Yl)Phenyl] Formamide Pendent Group", European Polymer Journal, 45(11): 3108-3115. Available Online Aug. 20, 2009.

Kowalczyk et al. "Crosslinked Polyimide Electro—Optic Materials", Journal of Applied Physics, 78(10): 5876-5883, Published Online Jun. 4, 1998.

*Primary Examiner* — Jas A Sanghera
(74) *Attorney, Agent, or Firm* — PV IP PC; Wei Te Chung; Ude Lu

(57) ABSTRACT

A crosslinked polyimide, a polyimide film and a method for preparing thereof, an organic light emitting diode (OLED) device. 4,40-diamino-400-N-carbazolyltriphenylamine and 1,2,4,5-cyclohexanetetracarboxylic dianhydride and a p-xylenediamine crosslinker are introduced in the present invention. The introduction of a diamine monomer with a large volume of pendant groups increases an asymmetry of the polyimide, destroys a close structure of the polymer, and reduces crystallization properties of the polypolymer, (Continued)

thereby effectively increasing its transmissibility. At the same time, a cross-linked agent, p-xylylenediamine, is introduced, and the cross-linked agent widens a molecular chain spacing, so that the polyimide molecule has a larger free volume. At the same time, the formation of cross-linked is beneficial to reduce a polarizability of the molecule, thereby reducing a dielectric constant of the material. An OLED device with a novel low dielectric constant and high transmittance is prepared in this way.

9 Claims, 2 Drawing Sheets

(52) U.S. Cl.
CPC ....... *H01L 51/0097* (2013.01); *C08J 2379/08* (2013.01); *H01L 2251/5338* (2013.01)

(56) References Cited

U.S. PATENT DOCUMENTS

| | | | | |
|---|---|---|---|---|
| 2004/0054096 A1* | 3/2004 | Hosaka | G02F 1/133723 525/420 |
| 2009/0029072 A1* | 1/2009 | Fujimoto | C08G 73/1075 528/347 |
| 2014/0275440 A1* | 9/2014 | Huang | C08G 73/1071 564/430 |
| 2020/0031997 A1 | 1/2020 | Ren et al. | |

FOREIGN PATENT DOCUMENTS

| | | |
|---|---|---|
| CN | 104136979 | 11/2014 |
| CN | 106990673 | 7/2017 |
| CN | 108707102 | 10/2018 |
| CN | 109134858 | 1/2019 |
| CN | 110128652 | 8/2019 |
| WO | WO 02/16474 | 2/2002 |

* cited by examiner

CROSSLINKED POLYMIDE, POLYMIDE FILM AND METHOD FOR PREPARING THEREOF, ORGANIC LIGHT EMITTING DIODE DEVICE

RELATED APPLICATIONS

This application is a National Phase of PCT Patent Application No. PCT/CN2019/091296 having International filing date of Jun. 14, 2019, which claims the benefit of priority of Chinese Patent Application No. 201910421646.X filed on May 21, 2019. The contents of the above applications are all incorporated by reference as if fully set forth herein in their entirety.

FIELD AND BACKGROUND OF THE INVENTION

The present invention relates to the field of chemistry, and in particular, to a crosslinked polyimide, a polyimide film and a method for preparing thereof, an organic light emitting diode (OLED) device.

With the development of electronic technology, sizes of electronic devices are getting smaller, and flexible panels have also sprung up like mushrooms. In the field of organic light emitting diode (OLED), flexible substrates and evaporation technology are two difficult technical problems. The difficulties include signal delay and power loss due to integration and high dielectric constant, low transmittance of conventional polyimide, and high encapsulation difficulty and so on. In order to solve the above problems, an interlayer dielectric material is required to have a low dielectric constant, and a bottom emission type light emitting device needs to have a light transmittance as high as possible. In general, flexible OLED devices still require a substrate material with a dielectric constant as low as possible and a transparency as high as possible.

At the beginning of 1905, Marston Bogert completed a synthesis of polyimide for the first time. At present, an application of polyimide is more and more extensive, but the basic synthesis principle is very simple, that is, using diacid and dianhydride to form polyimide under certain conditions. In recent years (2014), OLED screen applications have sprung up, and flexible substrates have been applied from stainless steel to glass materials to current polymer materials. Polyethylene naphthalate (PEN) was chosen as a first material used as a polymer material, but two key parameters of dielectric properties and transparency of PEN were inappropriate and were eventually discarded. Therefore, polyimide is reintroduced into the flexible substrate, and patents about polyimide materials have become a positive breakthrough direction for domestic companies. On one hand, application of polyimide is more and more extensive. On the other hand, fields involved its synthesis principle are becoming more and more narrow. For example, introduction of large side groups, introduction of fluorine atoms, introduction of flexible chains and other methods have already filed a lot of patents. However, development of different performances is still in a research stage, such as the materials properties required in substrates of the current OLED devices.

SUMMARY OF THE INVENTION

The present invention provides a polyimide film and a method for preparing thereof, an organic light emitting diode (OLED) device to solve the problems of signal delay and power loss due to integration and high dielectric constant, low transmittance of conventional polyimide, and high encapsulation difficulty and so on.

The present invention provides a crosslinked polyimide, comprising a diamine monomer having a long chain pendant group.

The present invention further provides a polyimide film, comprising the crosslinked polyimide of claim 1, a dielectric constant of the crosslinked polyimide ranges from 1.5 to 2, and a light transmittance rate of the crosslinked polyimide ranges from 80% to 99%.

The present invention further provides a method for preparing the polyimide film according to claim 2, wherein the method comprises the following steps:

S1, providing a crosslinked polyimide solution;

S2, coating the crosslinked polyimide solution on a glass substrate;

S3, removing 70% of a solvent in the crosslinked polyimide solution by high temperature vacuum drying;

S4, the crosslinked polyimide solution is crosslinked and cured by a flexible film post-drying machine to form a polyimide film.

Further, wherein the step of preparing the crosslinked polyimide solution is as follows:

S01, 4,40-diamino-400-N-carbazolyltriphenylamine, 1,2,4,5-cyclohexanetetracarboxylic dianhydride, and a solvent are added to a two-necked flask and stirred to obtain a first mixed solution;

S02, gradually adding a crosslinked agent to the first mixed solution and stirring at room temperature for 24 to 96 hours to fully dissolve the crosslinked agent to obtain a second solution;

S03, the second solution is subjected to suction filtration under vacuum to obtain a third solution, and the third solution is pumped through a vacuum pump for 1 hour;

S04, the third solution after the evacuation is standing at room temperature for 2 to 4 hours to further reduce the bubbles in the solution until the crosslinked polyimide solution is obtained without visible bubbles to a naked eye.

Further, in the step S2, the crosslinked polyimide solution is applied onto the glass substrate by a slit coating method.

Further, in the step S4, the flexible film post-drying machine cross-links and cures the crosslinked polyimide solution by multiple heating and cooling, comprising:

an initial drying, the crosslinked polyimide solution is directly heated to a maximum temperature of 420° C. to 500° C. and then cooled at a constant temperature for about 1 hour to obtain a first crosslinked polyimide.

Further, the method comprises:

a secondary drying, wherein providing at least 2 constant temperature platforms, the first crosslinked polyimide is sequentially heated to a temperature of a constant temperature platform and kept the temperature for 30 minutes, then cooling to obtain the crosslinked polyimide film.

Further, the crosslinked agent is p-xylylenediamine, the ratio of an amount of the 4,40-diamino-400-N-carbazolyltriphenylamine to the 1,2,4,5-cyclohexanetetracarboxylic dianhydride is 1:1.

Further, in the step S1, the solvent is a mixture of N,N-dimethylhexanamide and N-methylpyrrolidone, a volume ratio of the N,N-dimethylhexanamide to the N-methylpyrrolidone ranges from 0.1 to 4.

The present invention further provides an OLED device, comprising a substrate, a material of the substrate is the crosslinked polyimide.

The invention provides a crosslinked polyimide, a polyimide film and a method for preparing thereof, an OLED device, in which 4,40-diamino-400-N-carbazolyltriphenylamine and 1,2,4,5-cyclohexanetetracarboxylic dianhydride and a p-xylylenediamine crosslinker are introduced. The introduction of a diamine monomer with a large volume of pendant groups increases an asymmetry of the polyimide, destroys a close structure of the polymer, and reduces crystallization properties of the polypolymer, thereby effectively increasing its transmissibility. At the same time, a cross-linked agent, p-xylylenediamine, is introduced, and the cross-linked agent widens a molecular chain spacing, so that the polyimide molecule has a larger free volume. At the same time, the formation of cross-linked is beneficial to reduce a polarizability of the molecule, thereby reducing a dielectric constant of the material. An OLED device with a novel low dielectric constant and high transmittance is prepared in this way.

BRIEF DESCRIPTION OF THE SEVERAL VIEWS OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DESCRIPTION OF SPECIFIC EMBODIMENTS OF THE INVENTION

Figure 1:
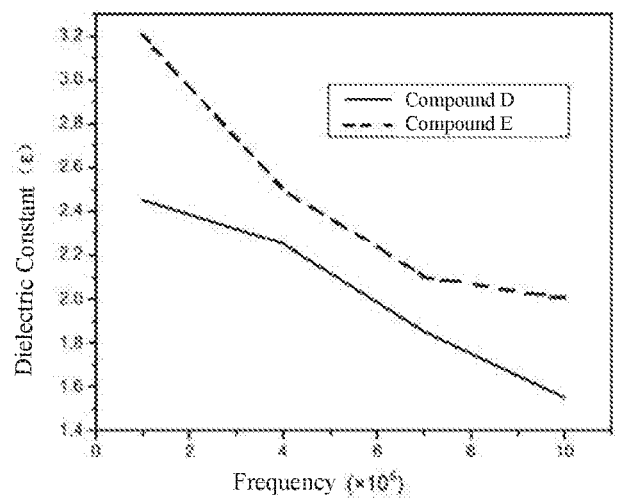
FIG. 1 is a light property transmittance test of a crosslinked polyimide using p-xylylenediamine as a crosslinked agent.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

In this embodiment, a crosslinked polyimide of the present invention has a diamine monomer having a large volume of pendant groups, and its molecular structural formula is as shown next page:

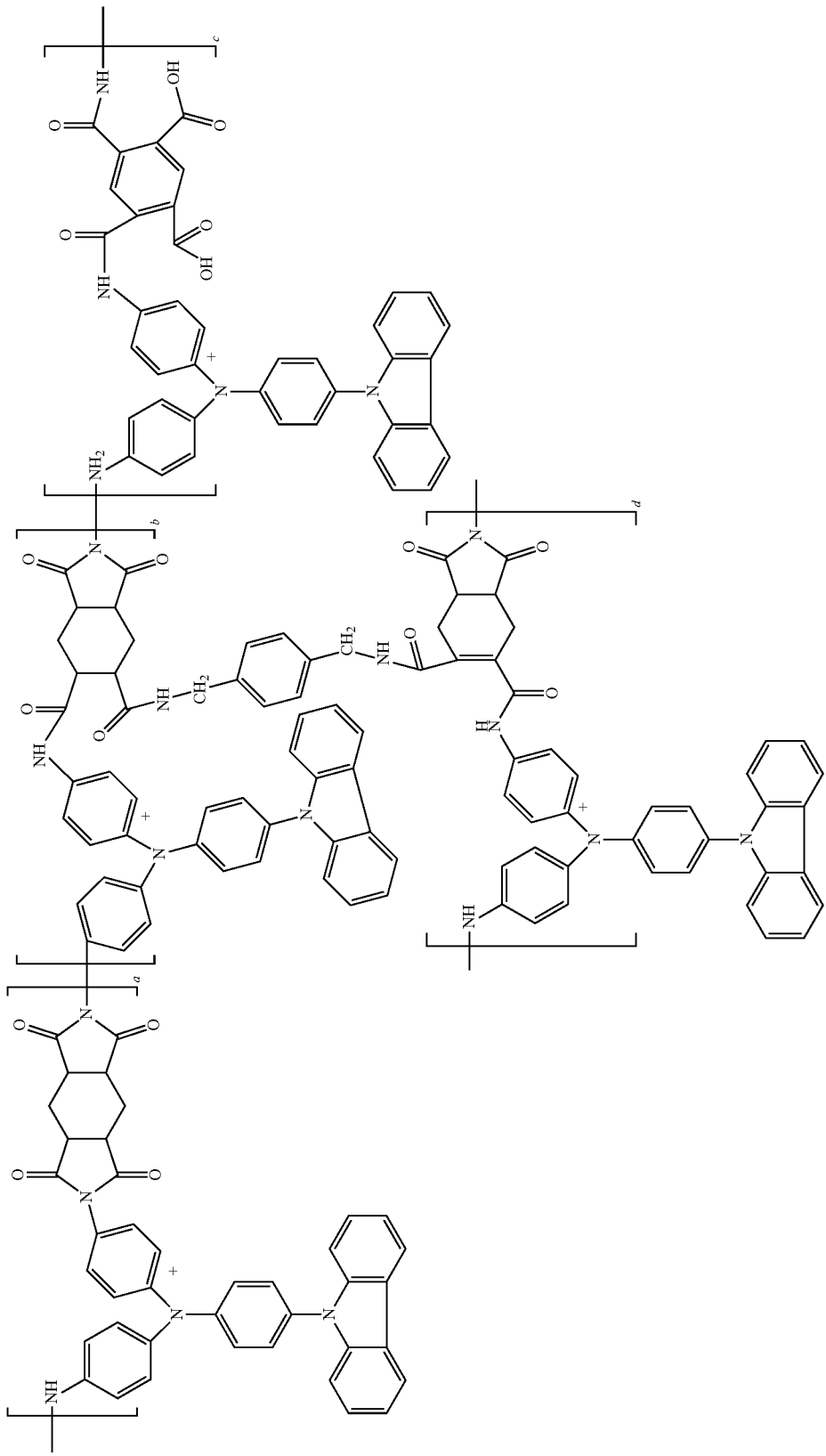

The crosslinked polyimide is used to prepare a polyimide film. The introduction of a diamine monomer with a large volume of pendant groups increases an asymmetry of the polyimide, destroys a close structure of the polymer, and reduces crystallization properties of the polypolymer, thereby effectively increasing its transmissibility. At the same time, a cross-linked agent, p-xylylenediamine, is introduced, and the cross-linked agent widens a molecular chain spacing, so that the polyimide molecule has a larger free volume. At the same time, the formation of cross-linked is beneficial to reduce a polarizability of the molecule, thereby reducing a dielectric constant of the material.

As shown in FIG. 1, FIG. 1 is a light property transmittance test of a crosslinked polyimide using p-xylylenediamine as a crosslinked agent. The dielectric constant of the crosslinked polyimide is measured by a capacitance method. Compared with conductivity test of polyimide obtained without p-xylylenediamine as a crosslinked agent, it can be seen that compound D (crosslinked polyimide using p-xylylenediamine as a crosslinking agent) has a dielectric constant of at least 1.55, while uncrosslinked compound E (polyimide without p-xylylenediamine as a crosslinking agent) can only reach 2.

Figure 2:
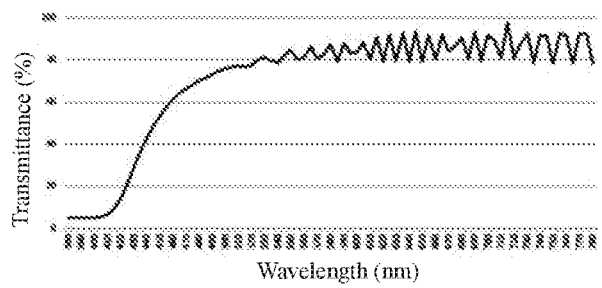
FIG. 2 is a graph showing a dielectric constant of a crosslinked polyimide using p-xylylenediamine as a crosslinked agent and a polyimide not using a crosslinked agent at different frequencies.

As shown in FIG. 2, FIG. 2 is a light transmission performance test of the crosslinked polyimide. At most wavelengths, the cross-linked polyimide has a light transmittance of 86% or more, which fits with permeability requirements (more than 75%) of all flexible panels in current.

In order to explain the present invention more clearly, the crosslinked polyimide material will be further explained below in conjunction with the crosslinked polyimide preparation method of the present invention.

In an embodiment of the present invention, a method for preparing a crosslinked polyimide of the present invention will be described in detail by taking a preparation of a target compound (a crosslinked polyimide material of the present invention) as an example.

The method for preparing the polyimide film according to the present invention comprises the following steps:

S1, providing a crosslinked polyimide solution;

S2, the crosslinked polyimide solution is applied onto the glass substrate by a slit coating method, advantages of slit coating are high uniformity of coating film, wide range of applicable coating viscosity, fast coating speed, and large-area coating film;

S3, removing 70% of a solvent in the crosslinked polyimide solution by high temperature vacuum drying, facilitating drying the crosslinked polyimide solution in the subsequent process;

S4, the crosslinked polyimide solution is crosslinked and cured by a flexible film post-drying machine to form a polyimide film.

Wherein the flexible film post-drying machine cross-links and cures the cross-linked polyimide solution to form a polyimide film through specific process conditions (FIG. 3 to FIG. 6). Specifically, a cross-linking curing process of the crosslinked polyimide lasts for 3-5 hours, a heating rate is 4-10° C., and a highest temperature is 420° C.-500° C. A drying stage is divided into hard drying and soft drying. Hard drying process is to directly raise a temperature to the highest temperature and then cool after about 1 hour. Soft frying process includes 2 or more constant temperature platform, and finally the temperature is cooled to achieve cross-linking and solvent removal of the material at different constant temperature stages. The method used in this patent includes but not limited to the above-described drying method and time interval.

Figure 3:
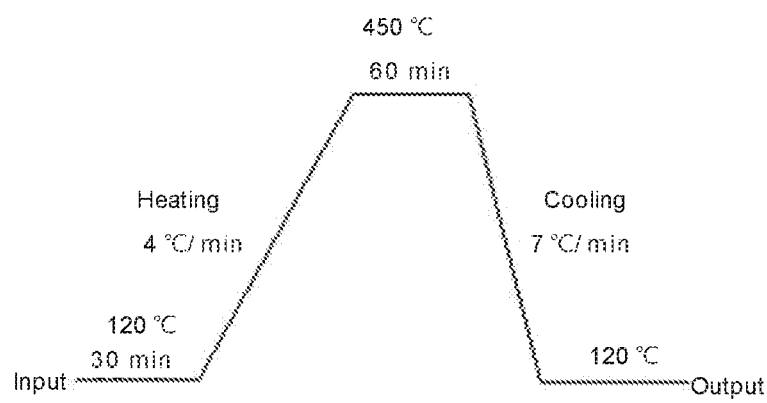
FIG. 3 is a specific process condition 1 for a post-dryer using a flexible film.
Figure 4:
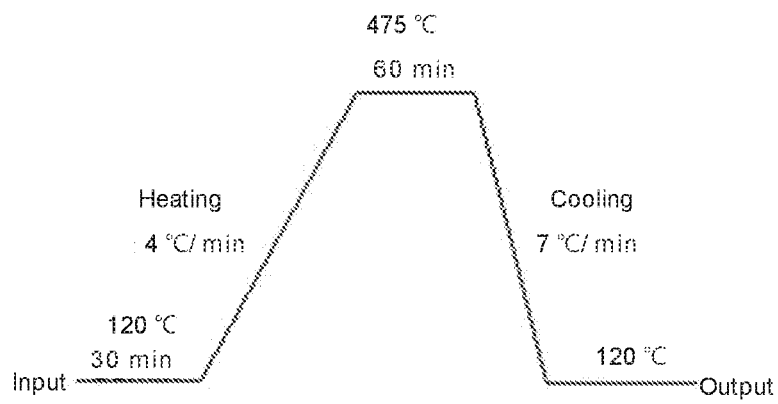
FIG. 4 is a specific process condition 2 for a post-dryer using a flexible film.
Figure 5:
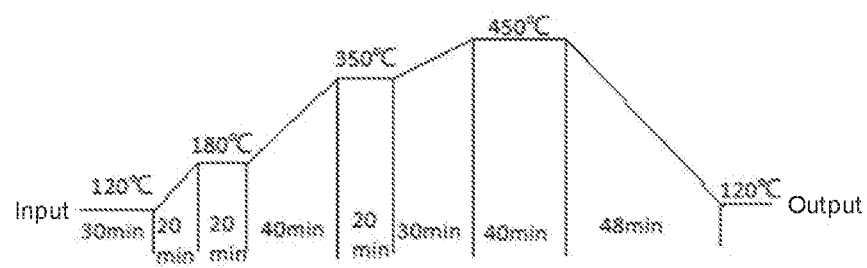
FIG. 5 is a specific process condition 3 for a post-dryer using a flexible film.
Figure 6:
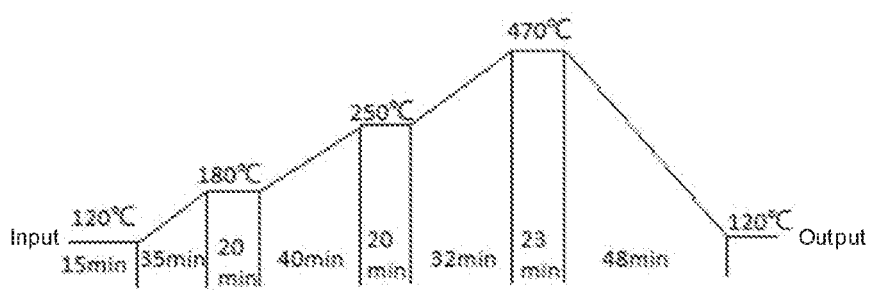
FIG. 6 is a specific process condition 4 for a post-dryer using a flexible film.

FIG. 3 contains a temperature rise and a constant temperature stage. The temperature of the dryer after the crosslinked polyimide solution enters the flexible film is 120° C., and keeping at a constant temperature for 30 minutes, then raising to a maximum temperature of 450° C. at a rate of 4° C./min for 60 min, then reduced to 120° C. at a rate of 4° C./min. FIG. 4 contains 2 temperature rise and 2 constant temperature stages, a maximum temperature is 475° C. and a constant temperature last for 60 min. FIG. 5 contains 3a temperature rise and 3 constant temperature stages, temperature rises to 180° C. and 350° C. respectively and then keeping for 20 min, then keeping 40 minutes when a maximum temperature reaching 450° C. FIG. 6 contains 4 temperature rise and 4 constant temperature stages. The temperature is kept at 180° C. and 250° C. for 20 min respectively, then keeping 23 minutes when a maximum temperature reaching 470° C.

The step of preparing the crosslinked polyimide solution in present invention is as follows:

S01, 4,40-diamino-400-N-carbazolyltriphenylamine, 1,2,4,5-cyclohexanetetracarboxylic dianhydride, and a solvent are added to a two-necked flask and stirred to obtain a first mixed solution. The amount of the 4,40-diamino-400-N-carbazolyltriphenylamine and the 1,2,4,5-cyclohexanetetracarboxylic dianhydride are both 0.1 mmol to 13 mmol. The solvent is a mixture of N,N-dimethylhexanamide (DMAC) and N-methylpyrrolidone (NMP), the volume ratio (DMAC/NMP) is 0.1 to 4. The molecular formula of the 4,40-diamino-400-N-carbazolyltriphenylamine is:

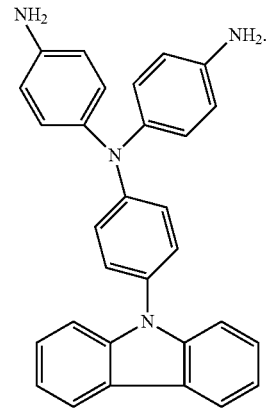 [SMILES: Nc1ccc(N(c2ccc(N)cc2)c2ccc(-n3c4ccccc4c4ccccc43)cc2)cc1]

The molecular formula of the 1,2,4,5-cyclohexanetetracarboxylic dianhydride is:

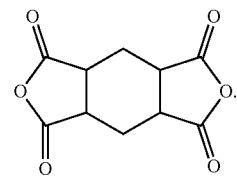 [SMILES: O=C1OC(=O)C2CC3C(=O)OC(=O)C3CC12]

S02, gradually adding a crosslinked agent to the first mixed solution and stirring at room temperature for 24 to 96 hours to fully dissolve the crosslinked agent to obtain a second solution. The crosslinked agent is p-xylylenediamine, an amount of the substance is 0.1 mmol to 6 mmol, and a molecular formula is:

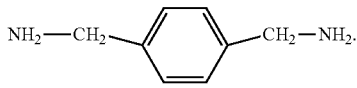

S03, the second solution is subjected to suction filtration under vacuum to obtain a third solution, and the third solution is pumped through a vacuum pump for 1 hour to remove air bubbles from the solution.

S04, the third solution after the evacuation is standing at room temperature for 2 to 4 hours to further reduce the bubbles in the solution until the crosslinked polyimide solution is obtained without visible bubbles to a naked eye.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A polyimide film, comprising a crosslinked polyimide, wherein the crosslinked polyimide comprises a diamine monomer having a long chain pendant group, a dielectric constant of the crosslinked polyimide ranges from 1.5 to 2, and a light transmittance rate of the crosslinked polyimide ranges from 80% to 99%.

2. A method for preparing the polyimide film according to claim 1, wherein the method comprises the following steps:
    S1, providing a crosslinked polyimide solution;
    S2, coating the crosslinked polyimide solution on a glass substrate;
    S3, removing 70% of a solvent in the crosslinked polyimide solution by high temperature vacuum drying;
    S4, the crosslinked polyimide solution is crosslinked and cured by a flexible film post-drying machine to form a polyimide film.

3. The method according to claim 2, wherein the step of preparing the crosslinked polyimide solution is as follows:
    S01, 4,40-diamino-400-N-carbazolyltriphenylamine, 1,2,4,5-cyclohexanetetracarboxylic dianhydride, and a solvent are added to a two-necked flask and stirred to obtain a first mixed solution;
    S02, gradually adding a crosslinked agent to the first mixed solution and stirring at room temperature for 24 to 96 hours to fully dissolve the crosslinked agent to obtain a second solution;
    S03, the second solution is subjected to suction filtration under vacuum to obtain a third solution, and the third solution is pumped through a vacuum pump for 1 hour;
    S04, the third solution after the evacuation is standing at room temperature for 2 to 4 hours to further reduce the bubbles in the solution until the crosslinked polyimide solution is obtained without visible bubbles to the naked eye.

4. The method according to claim 2, wherein
    in the step S2, the crosslinked polyimide solution is applied onto the glass substrate by a slit coating method.

5. The method according to claim 2, wherein
    in the step S4, the flexible film post-drying machine cross-links and cures the crosslinked polyimide solution by multiple heating and cooling, comprising:
    an initial drying, the crosslinked polyimide solution is directly heated to a maximum temperature of 420° C. to 500° C. and then cooled at a constant temperature for about 1 hour to obtain a first crosslinked polyimide.

6. The method according to claim 5, wherein the method further comprises:
    a secondary drying, wherein providing at least 2 constant temperature platforms, the first crosslinked polyimide is sequentially heated to a temperature of a constant temperature platform and kept the temperature for 30 minutes, then cooling to obtain the crosslinked polyimide film.

7. The method according to claim 3, wherein the crosslinked agent is p-xylylenediamine, the ratio of an amount of the 4,40-diamino-400-N-carbazolyltriphenylamine to the 1,2,4,5-cyclohexanetetracarboxylic dianhydride is 1:1.

8. The method according to claim 2, wherein in the step S1, the solvent is a mixture of N,N-dimethylhexanamide and N-methylpyrrolidone, a volume ratio of the N,N-dimethylhexanamide to the N-methylpyrrolidone ranges from 0.1 to 4.

9. An organic light emitting diode (OLED) device, comprising a substrate, a material of the substrate is a crosslinked polyimide comprising a diamine monomer having a long chain pendant group.

* * * * *